United States Patent [19]

Carter

[11] Patent Number: 4,948,374

[45] Date of Patent: Aug. 14, 1990

[54] ASSEMBLY FOR ELECTRICALLY CONNECTING CONDUCTIVE PATHS OF A FIRST BODY TO CONDUCTIVE PATHS OF A SECOND BODY

[75] Inventor: David P. Carter, Watlington, England

[73] Assignee: Dowty Electronic Components Limited, Cheltenham, United Kingdom

[21] Appl. No.: 339,988

[22] Filed: Apr. 18, 1989

[30] Foreign Application Priority Data

Apr. 21, 1988 [GB] United Kingdom ............... 8809402
Sep. 17, 1988 [GB] United Kingdom ............... 8821901

[51] Int. Cl.$^5$ ............................................ H01R 9/09
[52] U.S. Cl. .................................... 439/67; 439/329
[58] Field of Search ................................ 439/67-74, 439/77, 329, 330, 331, 493

[56] References Cited

U.S. PATENT DOCUMENTS 3,922,054 11/1975 Dechelette ...................... 439/329
4,390,220 6/1983 Benasutti ........................ 439/331

Primary Examiner—Neil Abrams
Attorney, Agent, or Firm—Young & Thompson

[57] ABSTRACT

A connector assembly which enables conductive paths of a first body to be electrically connected to the conductive paths of a second body. The assembly comprising:

at least two spigot members; and a connecting member having a cover member into which a resilient member and a displaceable member are assembled.

Each of the members of the connecting member are provided with corresponding orifices that form a passageway which is shaped so that it can engage with a groove formed on a respective spigot member. In operation, the spigot members are inserted into a respective passageway and the connecting member moved relative thereto so that the groove and passageway co-operate with one another to clamp the first and second bodies together, and thereby effect electrical connection between the respective conductive paths.

18 Claims, 8 Drawing Sheets

Fig 3A
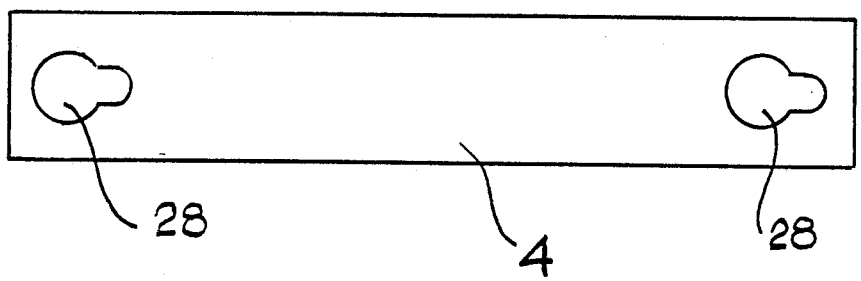
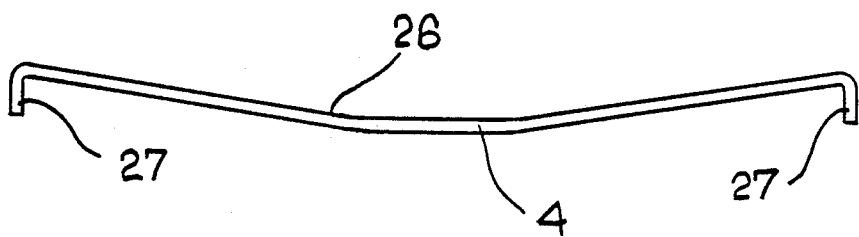
Fig 3B

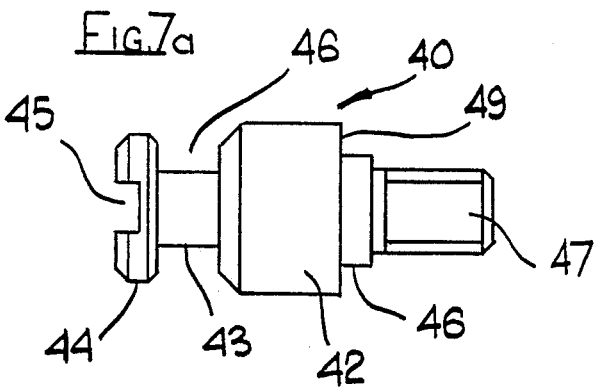
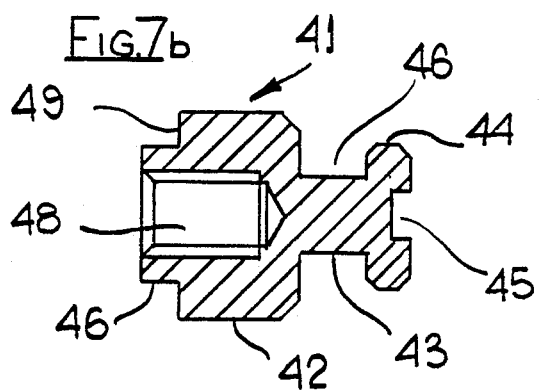
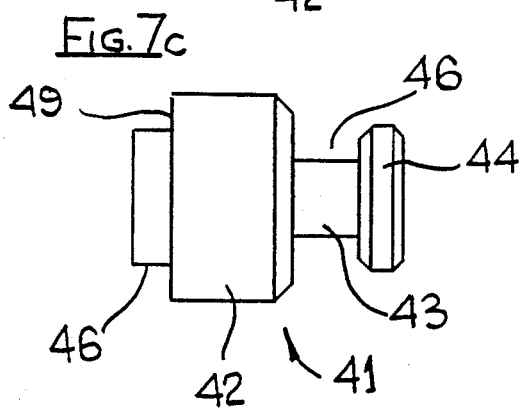

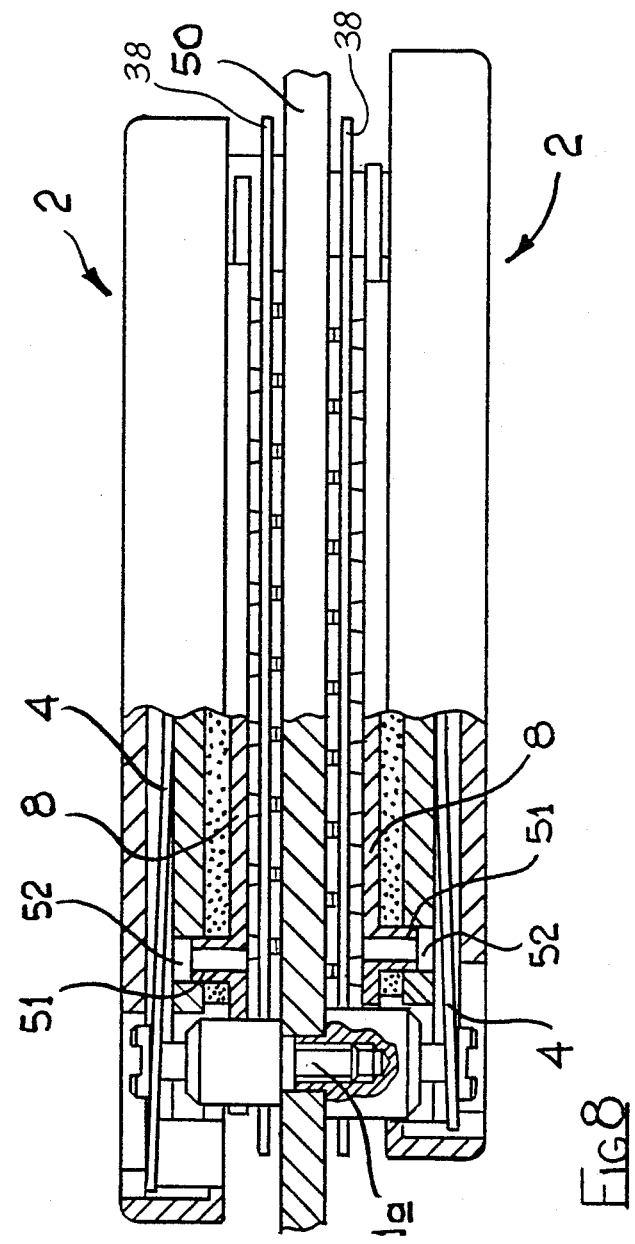

ASSEMBLY FOR ELECTRICALLY CONNECTING CONDUCTIVE PATHS OF A FIRST BODY TO CONDUCTIVE PATHS OF A SECOND BODY

This invention relates to a connector assembly and, in particular, a connector assembly which enables conductive paths of a first body to be electrically connected to the conductive paths of a second body.

In accordance with the present invention a connector assembly which enables conductive paths of first body to be electrically connected to conductive paths of a second body, includes:

at least two spigot members, each of which engages with a surface of the first body, and protrudes therethrough, and has a groove formed therein;

and a connecting member which comprises a cover member into which a resilient member and a displaceable member are assembled; and where each of the cover member, resilient member and displaceable member are provided with a co-operating orifice which forms a passageway shaped to cooperate with the groove in a respective spigot member, wherein in order to effect electrical connection between the conductive paths each spigot member is inserted into a respective passageway; and the connecting member is moved relative to the spigot members so that the groove and passageway cooperate with one another to clamp the first and second bodies together, and thereby effect electrical connection between the respective conductive paths.

In operation, when the connector assembly has been assembled so as to effect an electrical connection between the conductive paths of a first body and the conductive paths of a second body, the connecting member bears against the spigot members. Thereby the resilient member is deformed and a force is transmitted via the displaceable member to the respective conductive paths, so as to enhance the electrical connection therebetween.

Preferably, the conductive paths are electrically connected to one another by surface to surface connection. That is to say, the connector assembly preferably utilizes the surface mounted connector technology and principle.

Therefore, a connector assembly made in accordance with this invention is mechanically simple to operate and the electrical connection may be assembled and disassembled without any detrimental effect to the quality of the electrical connection.

Preferably, the displaceable member includes a deformable pad member. The inclusion of the deformable pad member in the connector assembly means that the force transmitted from the resilient member so as to enhance the electrical connection is substantial evenly distributed.

Preferably, the displaceable member further includes an interliner which is attached to the deformable pad member so that when the connector assembly is assembled the interliner is positioned between the deformable pad member and one of the two bodies.

The interliner, preferably, includes a shaped surface which interacts with the surface of the body with which it is in contact so as to further enhance the quality of the electrical connection. Preferably, the surface of the interliner carries a number of protrusions.

The interliner may be attached to the deformable pad member by means of adhesive.

In a preferred form, the interliner is provided with protrusions which extend through the deformable pad member and co-operate with holes provided in the displaceable member. In this way the interliner can be held in correct alignment to provide optimum enhancement of the quality of the electrical connection.

Preferably, the resilient member comprises a shaped Bow spring. The Bow spring may be manufactured from any suitable material, i.e. any material having the desired resilient qualities, for example, steel, nickel plated steel. Further, the spring may be coated/treated to prevent deterioration/corrosion thereof.

Preferably, the resilient member is mounted in the cover member of the connecting member so that it acts between the cover member and the displaceable member. In this way, the force which enhances the electrical connection, is transmitted to the displaceable member directly.

Preferably, two spigot members are mounted at opposing ends of the connector assembly, and are on either side of the conductive paths of the first and second bodies.

Preferably, each of the spigot members are of differing diameters. This ensures that the connector can only be mounted so as to interconnect the conductive paths of the two bodies in one particular orientation. Further, it enables the interliner to be correctly orientated, so that the shaped surface acts in the optimum fashion to exert the force transmitted therethrough from the resilient member. In effect this means that the force is transmitted to the two bodies preferentially in the vicinity of the conductive paths.

Preferably, each of the spigot members protrudes through both of the two bodies, to further increase the accuracy of the conductive path layout.

In a preferred embodiment of the connector assembly, each of the spigot members comprises a single unitary component, a section of which protrudes through the passageway of the first body, and which component includes a skirt section which cannot pass through the passageway and engages an under surface with respect to the connecting member of the first body.

With the above preferred embodiment, the connector assembly is particularly suited for use in circumstances where only one connecting member is to be mounted on the spigot members. Therefore, in this case, the conductive paths to be connected are provided with respect to one side of the first body for this electrical connection only.

In a second preferred embodiment of the connector assembly, each of the spigot members comprises a two piece member, the individual pieces of which are mechanically interengageable.

Preferably, each of the two pieces of spigot members are provided with a groove to enable a connecting member to be mounted thereon.

With this form of the second preferred embodiment of the spigot member, the connector assembly is particularly suited to enable electrical connection of conductive paths provide on both sides of the first body, by enabling connecting members to be mounted with respect to both sides of the first body by a single set of spigot members.

Where the spigot members of the connector assembly are adapted to allow for the mounting of connecting members on both sides of the first body each of the pieces of the spigot members preferably has a surface which engages with a surface of the first body.

However, in an alternative arrangement one of the pieces of the spigot member acts simply to provide a skirt member which engages with an under surface of the first body.

Preferably, the two pieces of the spigot members are mechanically interengaged by a screw threaded arrangement provided with respect thereto.

In certain circumstances the two spigot members may be formed as a single unit. However, preferably and particularly where the first body has conductive paths on both sides thereof for connection by means of a single set of spigot members, the spigot members are preferably independent of one another.

Due to the variety in the thicknesses of the bodies having conductive paths which are to be electrically connected to one another, the connector assembly, preferably, also includes spacers. These spacers would normally be placed around the spigot members so that the spacer, and thereby the spigot members act against the first body.

The invention also includes a method of electrically connecting the conductive paths of a first body with the conductive paths of a second body using a connector assembly made in accordance with the present invention.

The invention will now be illustrated, by way of description of two examples shown in the accompanying drawings, in which:

FIGS. 3a show a plan and side view of a to 3b resilient member for use in a connector assembly made in accordance with the present invention;

Figure 1:
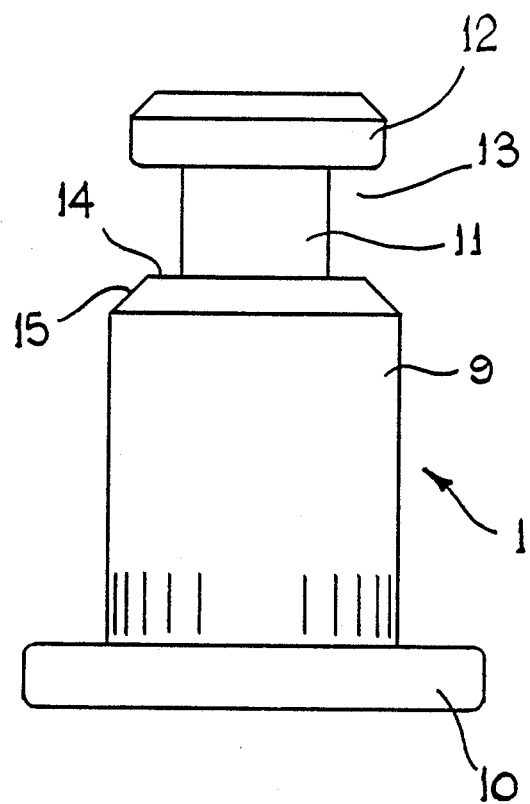
FIG. 1 shows a spigot member for use in a connector assembly made in accordance with the present invention.

FIGS. 7a show an alternative spigot member to 7c for use in a second form of connector assembly made in accordance with the present invention; and FIG. 8 shows a partially sectioned view of a second form of connector assembly in an assembled state made in accordance with the present invention, and incorporating two connecting members. Now referring to FIGS. 1 to 6 of the drawings, a connector assembly made in accordance with the present invention comprises:

two spigot members 1,
and a connecting member 2.
The connecting member 2 comprises:
a cover member 3;
a resilient member 4;
and a displaceable member 5, which includes a body member 6, a pad member 7 and an interliner 8.

Now referring to FIG. 1 of the drawings, each of the spigot members 1 is manufactured from a die-cast zinc alloy. In an alternative arrangement the spigot member may be a turned metal component.

Each spigot member is shaped so that it includes:
a cylindrical body section 9;
a base section 10 at one end of the body section 9 which extends beyond the body section 9;
a necked section 11;
and a head section 12 at the end of the body section 9 remote from the base section.

The necked section 11, the head section 12 and the end of the body section 9 remote from the base section 10 define a groove 13. Further, the surface 14 of the body section 10 which defines a side of the groove has a tapered portion 15.

To assist in the location, and orientation, of the connector assembly in use the two spigots are of differing diameters. This ensures the connector assembly may only be used in a particular orientation.

Figure 2A:
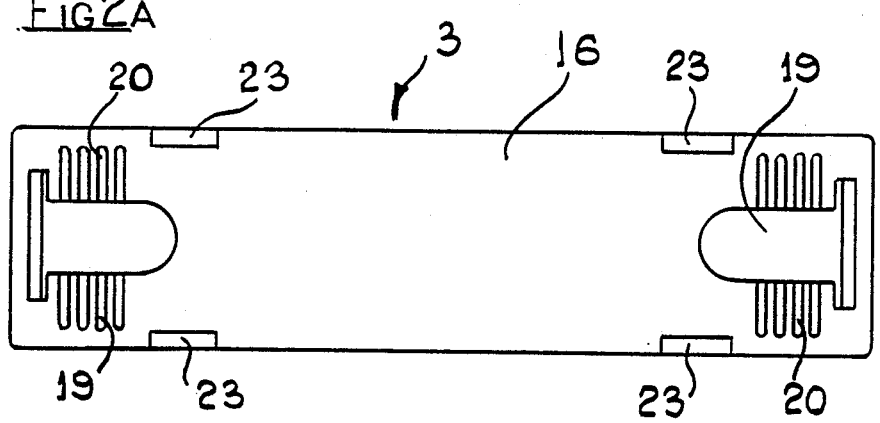
FIGS. 2a show a plan, reverse plan and
to 2c sectioned side view of a cover member for use in a connector assembly made in accordance with the present invention.
Figure 2B:
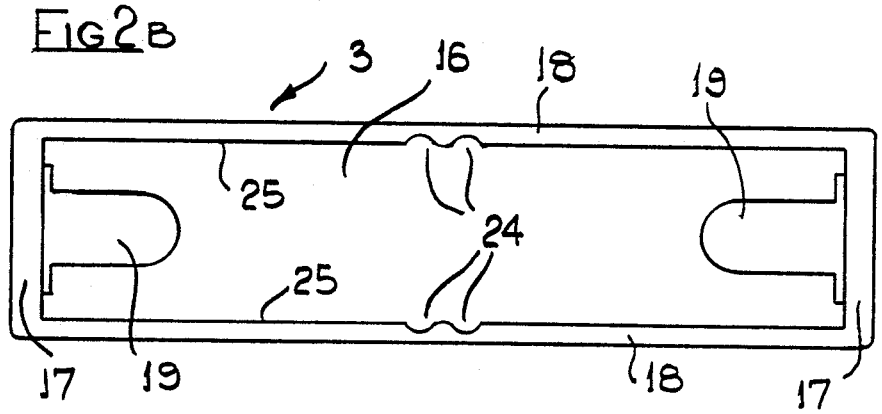
Figure 2C:
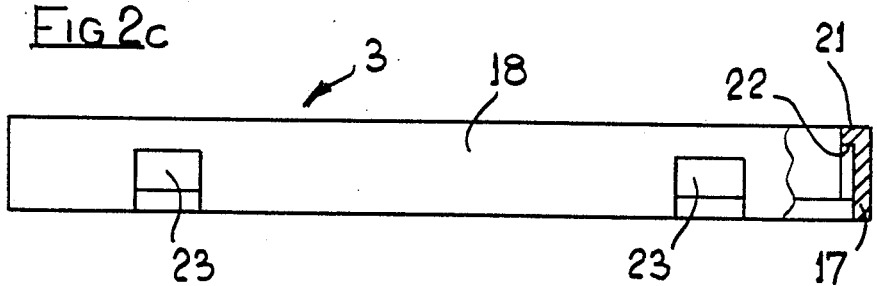

Now referring to FIGS. 2a, 2b and 2c of the drawings, the cover member 3 of the connecting member 2 is manufactured from a glass filled thermoplastic material and comprises:
an upper section 16;
two end walls 17;
and two side walls 18.

The upper section 16 has two orifices 19 formed therein, and positioned one at either end of the cover member 3. In the vicinity of each of the orifices 19 ribbed sections 20 are provided to enhance the grip on the cover member when a sliding force is applied thereto.

Each of the end walls 17 has an internally projecting abutment 21 which defines a shelf 22 at the end of the end wall remote from the upper section 16.

Each of the side walls 18 is provided with
two openings 23 therethrough;
and has two indentations 24 on the internal surface 25 thereof.

Now referring to FIGS. 3a and 3b of the drawings, the resilient member 4 of the connecting member 2 comprises a stainless steel Bow spring which is formed with
a bowed section 26;
two arms 27;
and two keyhole orifices 28, one at each end of the bowed section 26.

Figure 4A:
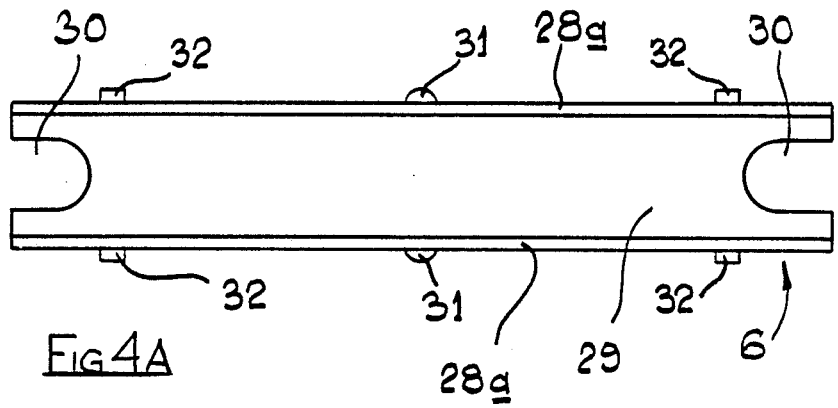
FIGS. 4a show a plan, side view and end to 4c view of a body section of the displaceable element for use in a connector assembly made in accordance with the present invention.
Figure 4B:
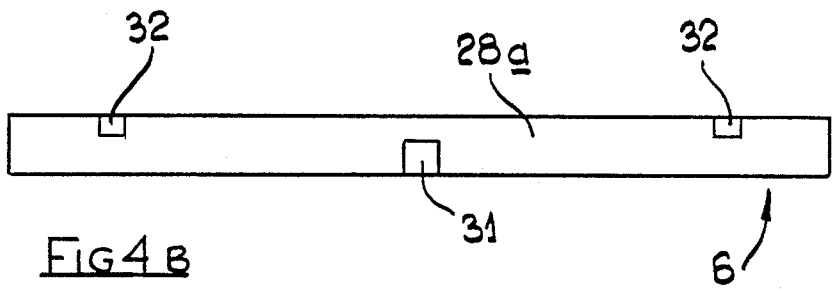
Figure 4C:
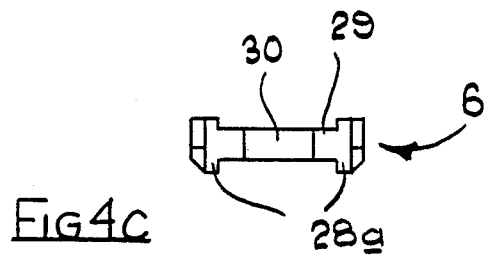

Now referring to FIGS. 4a, 4b and 4c of the drawings, the body member 6 of the displaceable member 5 is manufactured from plastics material and comprises:
two side sections 28a;
and a web section 29 which extends between the two side sections 28a.

The web section 29 has two orifices 30, one at each end thereof.

The outer facing surfaces of the side sections 28 are each provided with:
an abutment 31, which is positioned so that when the displaceable member 5 is mounted in the cover member 3 the abutment co-operates with one of the indentations 24;
and two projections 32, which when the displaceable member 5 is mounted in the cover member 3 co-operate with the openings 23 thereof.

Figure 5:
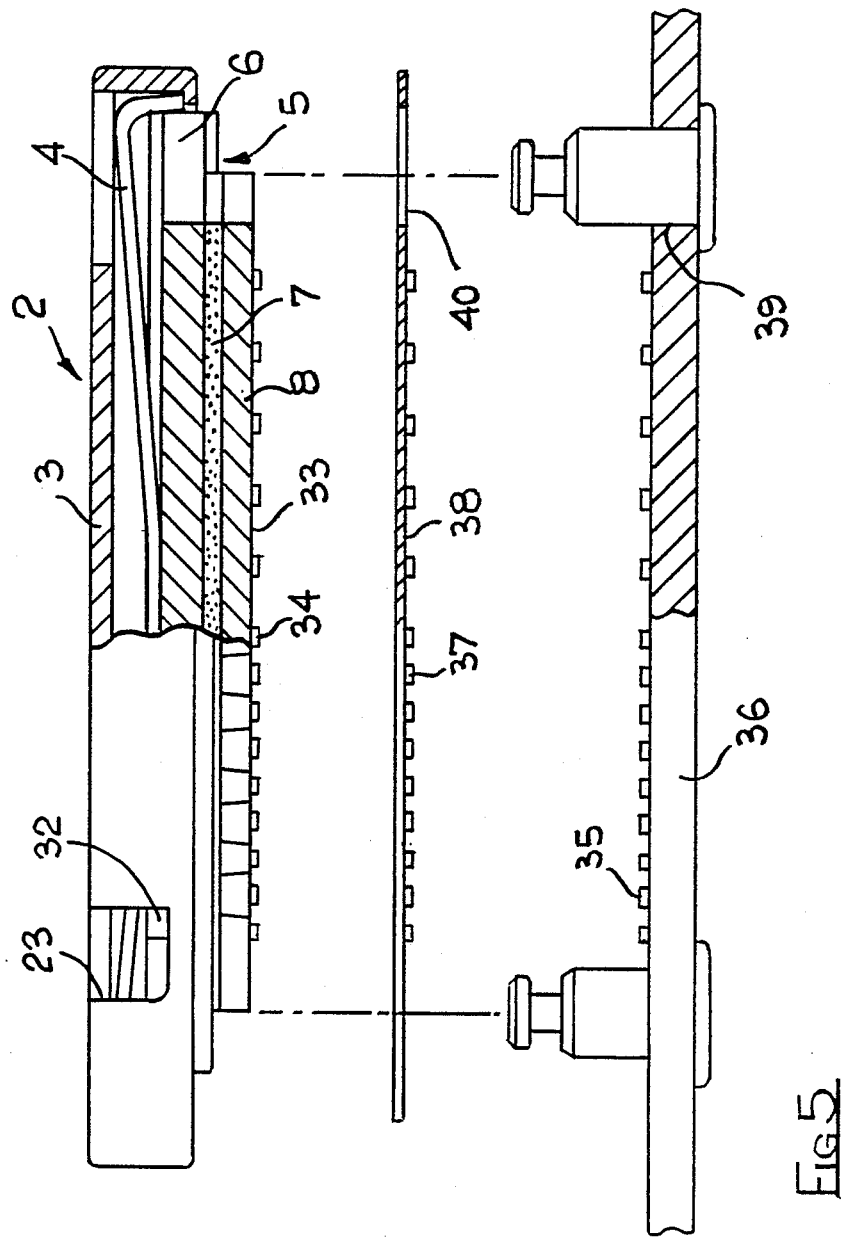
FIG. 5 shows a sectioned side view of a connector assembly, in an unassembled state, made in accordance with the present invention.
Figure 6:
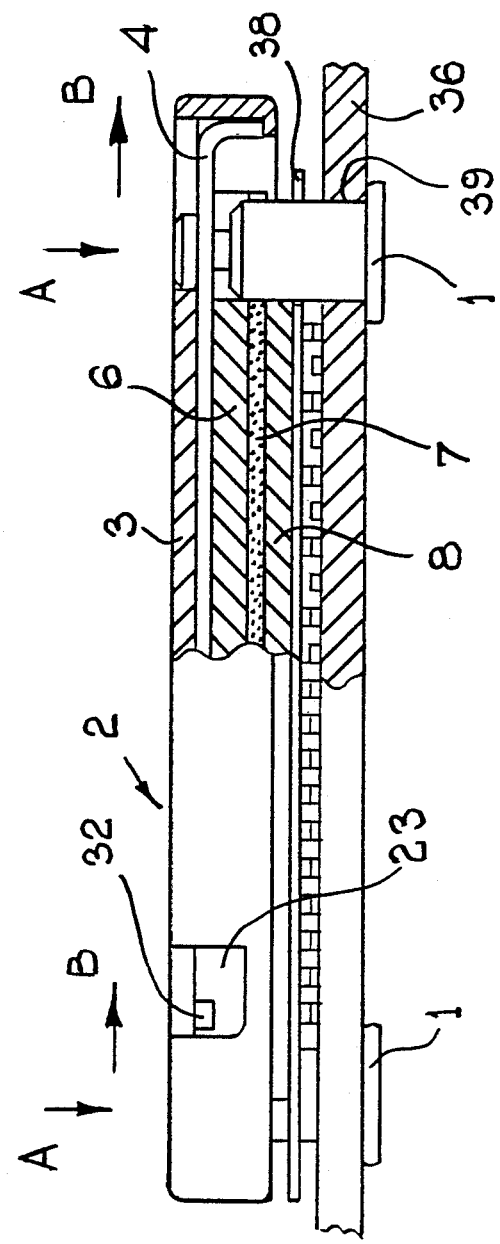
FIG. 6 shows a sectioned side view of a connector assembly, in an assembled state, made in accordance with the present invention.

Now referring to FIGS. 5 and 6 of the drawings, the pad member 7 of the connecting member 2 is made from a rubber/elastomer material, which deforms as a force is applied thereto.

The deforming of the pad member 7 means that as a force is applied, the force is transmitted in a substantial uniform distribution over the length of the connector assembly as a whole.

The interliner 8 is manufactured from a plastics material and comprises two longitudinally extending rows of offset teeth, and two orifices at the longitudinally opposed ends thereof. The lower surface 33 of the interliner 8 is provided with downwardly extending protrusions 34. These protrusions are set in a pattern which correspond to the desired conductive path interconnection between the two bodies.

In order to form the displaceable member 5 of the connecting member 2 the pad member 7 is secured by adhesive to an under surface of the web section 29 and located between the two side sections 28a;

and the interliner 8 is secured to the other side of the pad member 7 by adhesive.

The connecting member 2 may now be assembled. This is achieved by:

inserting the resilient member 4 into the cover member 3, so that the arms 27 of the member 4 engage the respective shelves 22 of the cover member;

and inserting the displaceable member 5, with the interliner 8 facing outwards into the cover member 3 so that the abutments 31 engage with respective indentations 24 and the projections 32 co-operate with the openings 23.

The displaceable member 5 is held in the cover member 3 by the co-operation of the projections 32 and the openings 23.

The bowed section 26 of the resilient member 4 engages with the web 29 of the displaceable member 5.

The orifices in the interliner 8, the body member 6 of the displaceable member 5 and the cover member and the keyhole orifices in the bowed section 26 of the resilient member 4 co-operate to form two passageways through the connecting member 2. Each of the keyhole orifices, in at least the bowed section 26 of the resilient member 4, is shaped with a necked section. The necked sections in both of the keyhole orifices extending longitudinally in the same direction.

In order to effect electrical connection between the conductive paths 35 on a PCB 36, and the respective conductive paths 37 on a flexible cable 38:

the two spigots are inserted into mounting holes 39 provided in the PCB, so that base section 10 of the spigot engages the PCB 36 on the side remote from the conductive paths 35;

the flexible cable 38 is placed over the spigot members so that the spigot members protrude through appropriate holes 40 therein;

the connecting member 2 is placed over the two spigot members so that the head sections 12 are within the confines of the respective passageway;

the connecting member 2 is forced in a direction indicated by arrow A so that the head sections 12 of the spigot members 1 protrude through the respective passageways, and the groove 13 of the spigot member is in approximate alignment with the bowed section 26 of the resilient member 4;

and forcing the connecting member 2 in the direction indicated by the arrow B.

By forcing the connecting member 2 in the direction indicated by the arrow B, the groove 13 of each spigot member 1 engages with the necked section of the keyhole orifice 28 in the bowed section 26 of the resilient member 4. The interaction of the shaping on the surfaces defining the groove 13 and the necked section of the orifice help to locate the connecting member 2 correctly with respect to the spigot members 1.

When assembled, as in the position shown in FIG. 6, the resilient member 4 acts against the PCB 36 and flexible cable 38 via the displaceable member 5, and in particular the protrusions 34 on the interliner 8 so as to enhance the electrical connection between the respective conductive paths 35 and 37.

Now referring to FIGS. 7a to 7c of the drawings, an alternative form of spigot member 1a is shown.

Each of the spigot members 1a comprises two pieces 40 and 41 made from stainless steel. Each of the pieces 40, 41 of the spigot member 1a is shaped so that it includes:

a cylindrical body section 42, a necked section 43, and a head section 44, having a slot 45 formed therein.

A groove 46 is defined in each piece 40, 41 of the spigot member 1a by the cylindrical body section 42, the necked section 43 and the head section 44.

Further, a recessed shelf 46 is provided in each piece 40, 41 of the spigot member 1a at the end thereof remote from the head section.

The recessed shelf 46 and the cylindrical body section 42 of each piece defines a surface 49.

One of the pieces 40 of the spigot member 1a is provided with an abutment 47 extending from the recessed shelf 46 thereof, and having a screw thread formed thereon. The other piece 41 of the spigot member 1a is provided with a recessed section 48 extending inwardly from the recessed shelf 46 thereof. The recessed section 48 is provided with a screw thread which acts with the screw thread of the abutment 47 to mechanically interconnect the two pieces of the spigot member 1a. Now referring to FIG. 8 of the drawings, a second form of connector assembly, in an assembled state, is shown. This form of connector assembly uses two of the spigot members 1a described with reference to FIGS. 7a to 7c of the drawings above, and includes two connecting members 2 mounted one at each end of the spigot members and on either side of a first body 50

Each of the connecting members 2 is substantially identical to that described with reference to FIGS. 2 to 6 of the drawings, and like numerals have been used to define like components. The differences therebetween are minor and comprise:

the resilient member 4 is formed without the two arms 27;

and the interliner 8 is provided with two protrusions 51 which extend through the deformable pad member 7 and into respective holes 52 provided in the displaceable member 5. The protrusions 51 and the holes 52 co-operate with one another to correctly align the interliner and provide optimum enhancement of the quality of the electrical connection.

Now, in order to effect electrical connection between the conductive paths 35 on a PCB 36, and the respective conductive paths 37 on two flexible cables 38:

the two pieces of the spigot members 1a are inserted into mounting holes 39 provided in the PCB are mechanically interengaged so that the surfaces 49 of the spigot members engage with the PCB 36, and the recessed shelves 46 are enclosed in the holes 39;

the two flexible cables 38 are placed over the spigot members so that the spigot members protrude through appropriate holes 40 therein;

the respective connecting members 2 are placed over the two spigot members so that the head sections 12 are within the confines of the respective passageway;

the respective connecting members 2 are forced in a direction indicated by arrow A so that the head sections 12 of the spigot members 1 protrude through the respective passageways, and the groove 13 of the spigot member is in approximate alignment with the bowed section 26 of the resilient member 4;

and forcing the respective connecting members 2 in the direction indicated by the arrow B.

By forcing the respective connecting member 2 in the direction indicated by the arrow B, the groove 13 of each spigot member 1 engages with the necked section of the keyhole orifice 28 in the bowed section 26 of the resilient member 4. The interaction of the shaping on the surfaces defining the groove 13 and the necked section of the orifice help to locate the respective connecting member 2 correctly with respect to the spigot members 1.

When assembled, as in the position shown in FIG. 8, the resilient member 4 acts against the PCB 36 and the flexible cables 38 via the displaceable member 5, and in particular the protrusions 34 on the interliner 8 so as to enhance the electrical connection between the respective conductive paths 35 and 37.

I claim:

1. A connector assembly which enables conductive paths on each side of a first body to be electrically connected to the conductive paths of a second body, including:
    at least two spigot members, each of which engages with a surface of the first body, and protrudes therethrough, and having a groove formed therein;
    at least two connecting members, each connecting member comprising a cover member into which a resilient member and a displaceable member are assembled; and wherein each of the cover member, resilient member and displaceable member are provided with a cooperating orifice which forms a passageway shaped to cooperate with the groove in a respective spigot member,
    wherein in order to effect electrical connection between the conductive paths each spigot member is inserted into a respective passageway; and each connecting member is moved relative to the spigot members so that the grooves and passageways cooperate with one another to clamp each second body to the first body, and thereby effect electrical connection between respective conductive paths by enabling the connecting members to be mounted with respect to both sides of the first body with a single set of spigot members.

2. A connector assembly as claimed in claim 1, wherein the conductive paths are electrically connected to one another by surface to surface connection.

3. A connector assembly as claimed in claim 1, wherein the displaceable member includes a deformable pad member.

4. A connector assembly as claimed in claim 3, wherein the displaceable member further includes an interliner which is attached to the deformable pad member so that when the connector assembly is assembled, the interliner is positioned between the deformable pad member and one of the two bodies.

5. A connector assembly as claimed in claim 4, wherein the interliner includes a shaped surface which interacts with the surface of the body with which it is in contact so as to further enhance the quality of the electrical connection.

6. A connector assembly as claimed in claim 5, wherein the surface of the interliner carries a number of protrusions.

7. A connector assembly which enables conductive paths of a first body to be electrically connected to conductive paths of a second body, includes:
    at least two spigot members, each of which engages with a surface of the first body, and protrudes therethrough, and having a groove formed therein;
    and a connecting member which comprises a cover member into which a resilient member and a displaceable member are assembled, the displaceable member including a deformable pad member and an interliner attached to the deformable pad member, the interliner being provided with protrusions which extend through the deformable pad member and cooperate with holes provided in the displaceable member; and where each of the cover member, resilient member and displaceable member are provided with a cooperating orifice which forms a passageway shaped to cooperate with the groove in a respective spigot member,
    wherein in order to effect electrical connection between the conductive paths each spigot member is inserted into a respective passageway; and the connecting member is moved relative to the spigot members so that the groove and passageway cooperate with one another to clamp the first and second bodies together, and thereby effect electrical connection between a respective conductive paths;
    and wherein the connector assembly is assembled, the interliner is positioned between the deformable pad member and one of the two bodies.

8. A connector assembly as claimed in claim 7, wherein the resilient member comprises a shaped Bow spring.

9. A connector assembly as claimed in claim 8, wherein the spring is coated/treated to prevent deterioration and corrosion thereof.

10. A connector assembly as claimed in claim 7, wherein the resilient member is mounted in the cover member of the connecting member so that it acts between the cover member and the displaceable member.

11. A connector assembly as claimed in claim 7, wherein two spigot members are mounted at opposing ends of the connector assembly, and are on either side of the conductive paths of the first and second bodies.

12. A connector assembly as claimed in claim 11, wherein the spigot members are of differing diameters.

13. A connector assembly as claimed in claim 7, wherein each of the spigot members protrudes through both of the two bodies, to further increase the accuracy of the conductive path layout.

14. A connector assembly as claimed in claim 7, wherein each of the spigot members comprises a single unitary component, a section of which protrudes through the passageway of the first body, and which component includes a skirt section which cannot pass through the passageway and engages an under surface with respect to the connecting member of the first body.

15. A connector assembly as claimed in claim 7, wherein each of the spigot members comprises a two piece member, the individual pieces of which are mechanically interengageable.

16. A connector assembly as claimed in claim 15, wherein each of the two pieces of spigot members are provided with a grove to enable a connecting member to be mounted thereon.

17. A connector assembly as claimed in claim 15, wherein each of the pieces of the spigot members has a surface which engages with a surface of the first body.

18. A connector assembly as claimed in claim 15, wherein the two pieces of the spigot members are mechanically interengaged by a screw threaded arrangement with respect thereto.

* * * * *